United States Patent [19]

Hozumi et al.

[11] Patent Number: 5,719,008
[45] Date of Patent: Feb. 17, 1998

[54] PHOTORESIST COMPOSITION COMPRISING A POLYFUNCTIONAL VINYL ETHER COMPOUND

[75] Inventors: Shigeo Hozumi, Toyonaka; Hiroya Nakagawa, Ibaraki, both of Japan

[73] Assignee: Sumitomo Chemical Company, Limited, Osaka, Japan

[21] Appl. No.: 525,186

[22] Filed: Sep. 8, 1995

[30] Foreign Application Priority Data

Sep. 12, 1994 [JP] Japan .................................. 6-217663
Sep. 12, 1994 [JP] Japan .................................. 6-217665

[51] Int. Cl.⁶ .................. G03C 1/72; G03C 1/73; C08F 2/50
[52] U.S. Cl. ........................... 430/287.1; 430/281.1; 430/288.1; 430/920; 430/921; 522/63; 522/181
[58] Field of Search .............................. 430/171, 176, 430/281.1, 287.1, 288.1, 920, 921; 522/63, 181

[56] References Cited

U.S. PATENT DOCUMENTS

| | | | |
|---|---|---|---|
| 4,388,450 | 6/1983 | Crivello | 560/190 |
| 4,478,810 | 10/1984 | Bloss et al. | 423/555 |
| 4,518,788 | 5/1985 | Crivello | 560/64 |
| 4,705,887 | 11/1987 | Crivello | 525/502 |
| 4,707,588 | 11/1987 | Takazume et al. | 219/400 |
| 4,994,346 | 2/1991 | Meier et al. | 430/280 |
| 5,004,842 | 4/1991 | Klemarczyk et al. | 568/640 |
| 5,057,397 | 10/1991 | Miyabe et al. | 430/270.1 |
| 5,069,997 | 12/1991 | Schwalm et al. | 430/270.1 |
| 5,070,117 | 12/1991 | Klemarczyk et al. | 522/31 |
| 5,079,129 | 1/1992 | Roth et al. | 430/280 |
| 5,362,822 | 11/1994 | Hefner, Jr. | 525/523 |
| 5,510,540 | 4/1996 | Hozumi et al. | 568/640 |

FOREIGN PATENT DOCUMENTS

| | | |
|---|---|---|
| 0 302 019 | 2/1989 | European Pat. Off. . |
| 0 539 606 | 5/1993 | European Pat. Off. . |
| 0 592 790 | 4/1994 | European Pat. Off. . |
| 0592790A1 | 4/1994 | European Pat. Off. ........ G03F 7/004 |
| 0 611 784 | 8/1994 | European Pat. Off. . |
| 0611798 | 8/1994 | European Pat. Off. . |
| 60-053517 | 3/1985 | Japan . |
| 60-71657 | 4/1985 | Japan . |
| 3260651 | 11/1991 | Japan . |

OTHER PUBLICATIONS

English translation of JP 60–71657, Watanabe et al., Apr. 1985.

English translation of JP–3–260651, Matsumura et al., Nov. 1991.

Database WPI, Week 9514, Derwent Publications Ltd., London, GB; AN 95–102684 & JP–A–07 028241 (Sumitomo Chemical Company, Ltd.), Jan. 31, 1995—Abstract.

Primary Examiner—George F. Lesmes
Assistant Examiner—Bernard P. Codd
Attorney, Agent, or Firm—Birch, Stewart, Kolasch & Birch, LLP

[57] ABSTRACT

A photoresist composition is disclosed which includes:

(1) a photopolymerizable monomer represented by the following formula (I) or its derivative:

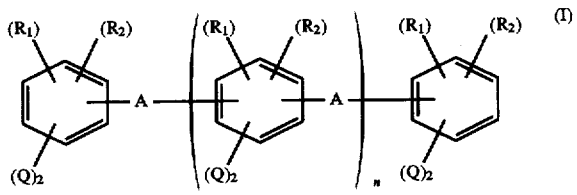

wherein n represents a number of from 0 to 20; $R_1$ and $R_2$ represents a hydrogen atom, a halogen atom, an alkyl group, an aryl group, an aralkyl group, an alkoxy group, an aryloxy group or a cycloalkyl group; each of Q represents —OH or —OROCH=$CH_2$ in which R represents an alkylene group, provided that the molar ratio of (—OH)/(—OROCH=$CH_2$) is from 10/90 to 90/10; and A represents a divalent hydrocarbon group or a divalent group having Q on it;

(2) a triazine compound having a methyl group substituted with one, two or three halogen atoms; and (3) a solvent, which can be used in photolithography or for producing a color filter.

10 Claims, No Drawings

PHOTORESIST COMPOSITION COMPRISING A POLYFUNCTIONAL VINYL ETHER COMPOUND

The present invention relates to a photoresist composition usable for photolithography, a pigment dispersing color filter, etc.

As a photopolymerizable monomer used for a negative working photoresist, acrylate resins such as a polyfunctional epoxy acrylate and a polyfunctional acrylate, and an epoxy resin are known.

As a resin composition used for a positive working photoresist, for example, a composition comprising a novolac resin and a quinone diazide compound has been known and widely used.

As a negative working photoresist containing a photopolymerizable monomer having a vinyloxyalkyl group, those described e.g. in JP-A-60-7165, JP-A-63-71840 or JP-A-64-88538 are known. All of the photopolymerizable monomers having a vinyloxyalkyl group described in those documents are vinyloxyalkylated novolacs produced by a condensation reaction of a monohydric phenol such as cresol with an aldehyde such as formalin, and are different from the photopolymerizable monomer used in the present invention described hereinafter.

The conventional negative working photoresist comprising an acrylate resin as a photopolymerizable monomer has a problem in that the occurrence of polymerization hindrance with oxygen is inevitable, and, as a result, the hardenability of the surface of hardening film is very insufficient. Therefore, the hardening of photoresist needs to be carefully handled, such that the environment of the photoresist to be hardened needs to be purged with nitrogen gas, the surface of photoresist to be hardened needs to be overcoated with an oxygen intercepting layer or the like.

A negative working photoresist which utilizes a photo ring-opening polymerization of an epoxy resin as the hardening reaction does not cause a polymerization hindrance with oxygen. However, its hardening rate is much slower than that of the negative working photoresist comprising an acrylate resin. Therefor, neither of the negative working photoresist mentioned above are sufficient in properties required as a photoresist.

In the case of the above-mentioned resin composition which comprises a vinyloxyalkylated novolac produced by a condensation reaction of a monohydric phenol such as cresol with an aldehyde such as formalin, as a photopolymerizable monomer, and which are described e.g. in JP-A-60-7165, JP-A-63-71840, JP-A-64-88538, it is difficult to simultaneously attain a high sensitivity and a developability with an aqueous alkalin solution, because of a small content of a phenolic hydroxy group in the monomer molecule.

In the case of a pigment dispersing photoresist, due to the pigment dispersed in the photoresist, the sensitivity decreases conspicuously. Therefore, in the case of a pigment dispersing photoresist, particularly the photoresist used for producing a coated film having a high light shield ratio, it is very difficult to obtain sufficient sensitivity.

SUMMARY OF THE INVENTION

It is an object of the present invention to provide a photoresist composition not only in which hardening is not hindered with oxygen, as the result, e.g. sufficient hardenability of the surface of hardening film is attained, but also which exhibits excellent photoresist characteristics such as a high resolution, a high developability with an aqueous alkalin solution and, particularly, high sensitivity, while maintainig the quick hardening property and good properties as a hardened product same to those of a conventional acrylate resin.

Hitherto, when the characteristics of the photoresists, i.e. a positive working and negative working, are different, the resin compositions of the photoresists have been usually different. Accordingly, when the photoresist characteristic needs to be changed in one production line from a positive working to a negative working photoresist, vice versa, because the resin composition used in the photoresists also needs to be changed, it is required to largely change the hardening conditions in the production line such as coating conditions of the photoresist to a substrate, prebake or post exposure bake conditions and conditions of post hardening after the development, and/or the developing conditions.

Another object of the present invention is to provide a photoresist composition which can be used not only as a positive working photoresist but also as a negative working photoresist wherein the change of the characteristics can be attained only by changing the kind or amount of a triazine compound, an ingredient of the photoresist composition, or by changing the exposure amount; and
which has sufficient sensitivity and resolution not only as a negative working photoresist but also as a positive working photoresist.

The inventors of the present invention have conducted extensive studies to accomplish the above-mentioned objects, and have found that the problems of the conventional photoresist can be solved by using a photoresist of a specific composition. Thus, the present invention have been accomplished.

The subject matter of the present invention is directed to a negative working photoresist composition (N-1) which comprises;

(1) a photopolymerizable monomer (I) represented by the following general formula (I):

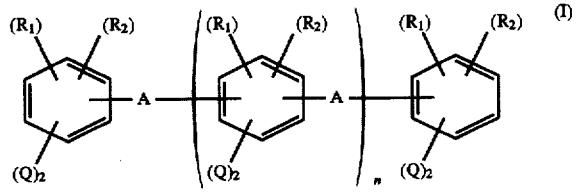

wherein n, which is an average repeating number, represents a number of from 0 to 20; $R_1$ and $R_2$ each independently represents a hydrogen atom, a halogen atom, an alkyl group, an aryl group, an aralkyl group, an alkoxy group, an aryloxy group or a cycloalkyl group; each of Q independently represents —OH or —OROCH=CH$_2$ in which R represents an alkylene group having 1–12 carbon atoms, provided that the molar ratio of (—OH)/(—OROCH=CH$_2$) is from 10/90 to 90/10; and A represents a divalent hydrocarbon group having 1–30 carbon atoms;

(2) a triazine compound represented by the following general formula (II):

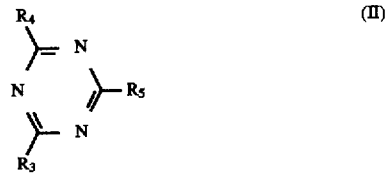

wherein $R_3$, $R_4$ and $R_5$ each independently represents an alkyl, aryl, alkenyl, alkoxy, aralkyl or alkylthio group which may be optionally substituted, provided that at least one of $R_3$, $R_4$ and $R_5$ is a methyl group substituted with one, two or three halogen atoms; and
(3) a solvent.

Another embodiment of the present invention is a negative working photoresist composition (N-2) which comprises;
(1) a photopolymerizable monomer (I-2) which is represented by formula (I) except that from 0.1 to 60% by mole of each of groups represented by the following formulae (III) or (IV):

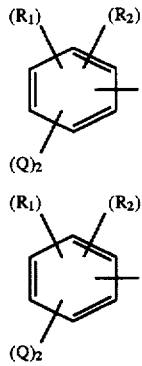

wherein $R_1$, $R_2$ and Q are as defined above are replaced, respectively, with each of groups represented by the following formulae (V) or (VI):

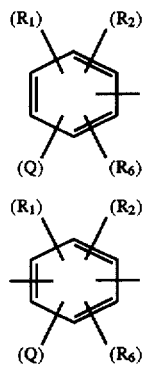

wherein $R_1$, $R_2$ and Q are as defined above, and $R_6$ represents a hydrogen atom, a halogen atom, an alkyl group, an aryl group, an aralkyl group, an alkoxy group, an aryloxy group or a cycloalkyl group;
(2) a triazine compound of formula (II); and
(3) a solvent.

A further embodiment of the present invention is a photoresist composition (NP) which comprises; (1) a photopolymerizable monomer (VII) represented by the following general formula (VII):

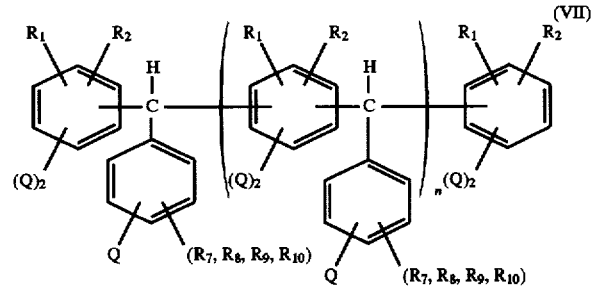

wherein n, $R_1$, $R_2$ and Q are as defined above; and ($R_7$,$R_8$, $R_9$,$R_{10}$) means that $R_7$, $R_8$, $R_9$ and $R_{10}$ are attached to a benzene ring, and $R_7$, $R_8$, $R_9$ and $R_{10}$ each independently represents a hydrogen atom, a halogen atom, an alkyl group, an aryl group, an aralkyl group, an alkoxy group, an aryloxy group or a cycloalkyl group;
(2) a triazine compound of formula (II); and
(3) a solvent.

DETAILED DESCRIPTION OF PREFERRED EMBODIMENTS

Examples of the atoms or groups denoted by $R_1$, $R_2$ or $R_6$ in formula (I), (V), (VI), etc., and examples of the atoms or groups denoted by $R_7$, $R_8$, $R_9$ or $R_{10}$ in formula (VII) include a hydrogen atom; a halogen atom such as fluorine, chlorine and bromine; an alkyl group such as methyl, ethyl, propyl and butyl; an aryl group such as phenyl, tolyl and naphthyl; an aralkyl group such as benzyl, phenethyl and benzhydryl; an alkoxy group such as methoxy, ethoxy and propoxy; an aryloxy group such as phenoxy, naphthoxy and anthroxy and a cycloalkyl group such as cyclopentyl and cyclohexyl.

The group denoted by Q in formula (I) and (VII), etc. is —OH or —OROCH=$CH_2$ wherein R is as defined above. The groups denoted by Q may be different each other even among those attached to same benzene ring in a molecular. Molar ratio of (—OH)/(—OROCH=$CH_2$) may vary within a range of from 10/90 to 90/10. Examples of the group denoted by R in —OROCH=$CH_2$ include a straight chain and branched chain alkylene group such as methylene, ethylene, propylene, butylene, hexylene, nonylene and dodecylene.

Examples of the group denoted by A in formula (I) include alkylene groups having 1–30 carbon atoms such as methylene, ethylene, butylene, ethylmethylene and 2-ethylpenthylmethylene; cycloalkylene such as cyclohexylene, cyclooctylene and cyclopentylene; arylene groups such as 1,3-benzene dimethylene, phenylmethylene, 1,4-benzene dimethylene, 2,2-bis-(4-phenylene)propane, 4-methoxyphenylmethylene, bis-(4-phenylene)methane and 4,4-diphenylene dimethylethane; and divalent hydrocarbon groups having 1–30 carbon atoms and having a cyclic terpene skeleton such as limonene, dipentyne, terpinolene and pinene.

Number n in formula (I) and (VII) is from 0 to 20, preferably from 0 to 10. If n exceeds 20, the solubility of (1) the compound in (3) a solvent is undesirablly lowered.

The photopolymerizable monomer (I) can be usually produced by allowing a compound ($S_1$) represented by the following general formula (VIII):

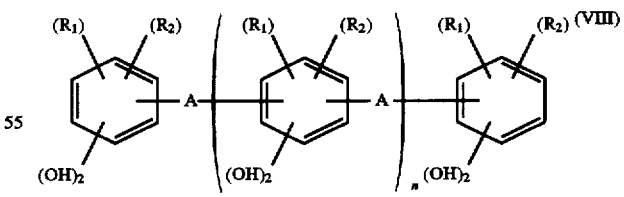

wherein n, $R_1$, $R_2$ and A are as defined above to contact and react with a haloalkyl vinyl ether compound (T) represented by formula of XROCH=$CH_2$ wherein R is as defined above and X represents a halogen atom.

The photopolymerizable monomer (I-2) can be usually produced by allowing a compound ($S_2$) which is represented by the formula (VIII) except that from 0.1 to 60% by mole of each of groups represented by the following formulae (N) or (X):

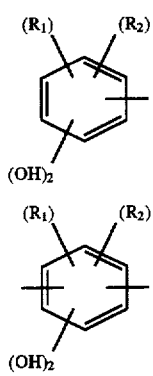

(IX)

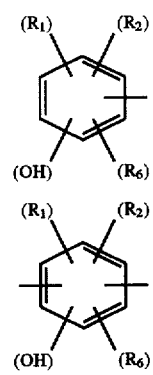

(X)

wherein $R_1$ and $R_2$ are as defined above are replaced with each of groups represented by the following formulae (XI) or (XII):

(XI)

(XII)

wherein $R_1$, $R_2$ and $R_6$ are as defined above, respectively to contact and react with a haloalkyl vinyl ether compound (T) represented by formula of $XROCH=CH_2$ wherein R is as defined above and X represents a halogen atom.

The photopolymerizable monomer (VII) can be usually produced by allowing a Compound $(S_3)$ represented by the following general formula (XIII)

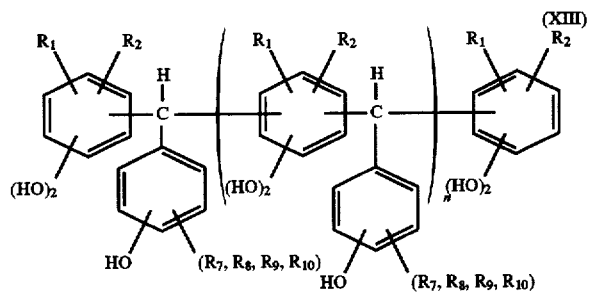

(XIII)

wherein n, $R_1$, $R_2$, $R_7$, $R_8$, $R_9$ and $R_{10}$ are as defined above to contact and react with a haloalkyl vinylether compound (T) represented by formula of $XROCH=CH_2$ wherein R and X are as defined above.

The compound $(S_1)$ is a known compound and can be produced through a reaction of a dihydric phenol with an aldehyde, ketone or diene compound.

The compound $(S_2)$ is also a known compound and can be produced through a reaction of a dihydric phenol and monohydric phenol with an aldehyde, ketone or diene compound.

The compound $(S_3)$ can be produced through a reaction of a dihydric phenol with an hydroxy benzaldehyde compound.

Examples of the dihydric phenol used for producing compound $(S_1)$, $(S_2)$ or $(S_3)$ include resorcin, 2-methylresorcin, 5-methylresorcin, catechol, 3-methylcatechol, hydroquinone and methylhydroquinone.

Examples of the monohydric phenol used for producing compound $(S_2)$ include phenol, o-cresol, m-cresol, p-cresol, 2,6-xylenol and p-t-octylphenol.

Examples of the aldehyde used for producing compound $(S_1)$ or $(S_2)$ include formaldehyde, acetoaldehyde, n-butylaldehyde and benzaldehyde. Examples of the ketone used for producing compound $(S_1)$ or $(S_2)$ include cyclohexanone and cyclooctanone.

Examples of the diene used for producing compound $(S_1)$ or $(S_2)$ include dicyclopenta diene.

Examples of the hydroxy benzaldehyde compound used for producing compound $(S_3)$ include 2-hydroxy benzaldehyde, 3-hydroxy benzaldehyde, 4-hydroxy benzaldehyde and 4-hydroxy-3-methyl-benzaldehyde.

As the haloalkyl vinylether compound (T) used for producing photopolymerizable compound (I), (I-2) or (VII), 2-chloroethyl vinylether is usually used.

In the reaction of the compound $(S_1)$, $(S_2)$ or $(S_3)$ with the haloalkyl vinylether compound (T), a proper condensing agent, for example a base, can be added in order to accelerate the reaction rate. Examples of the base include anhydrous sodium carbonate; sodium hydride; potassium carbonate; metallic sodium; an alkali metal alcoholate such as sodium methylate; a quaternary ammonium salt such as triethylbenzyl ammonium chloride, tetraethyl ammonium chloride and tributylbenzyl ammonium chloride; sodium hydroxyde; and potassium hydroxyde. The base needs to be added in an amount of from 0.1 to 10.0 moles, preferably from 0.3 to 2.0 moles per 1 equivalent of —OH group of the compound $(S_1)$, $(S_2)$ or $(S_3)$, in order to obtain high reaction accelerating effect.

The reaction of the compound $(S_1)$, $(S_2)$ or $(S_3)$ with the haloalkyl vinylether compound (T) can be conducted in an inert solvent such as ethyl cellosolve, dimethylsulfoxide, ethyleneglycol monomethylether and dimethyl acetoamide. Though reaction temperature is not limited, it is preferably in an range of from room temperature to 100° C.

For isolating and purifying the photopolymerizable compound (I), (I-2) or (VII) obtained through the above mentioned reaction, any known method can be employed. For example, after cooling the reaction mixture to room temperature, the organic layer is extracted with toluene or methyl isobutyl ketone, the extract is washed several times with water to remove the unreacted compound and inorganic salts, and after drying the organic layer with a drying agent such as anhydrous sodium sulfate, etc., the dried organic layer is concentrated under reduced pressure to provide the desired product. The method is not limited to the above.

Each of the photoresist resin compositions (N-1), (N-2) and (NP) of the present invention may further comprise a binder polymer having no photosensitive functional group, if necessary. As the binder polymer, a polymer having a good compatibility with the photopolymerizable monomer and a photopolymerization initiator, and having an appropriate solubility in an organic solvent, a high strength and a softening temperature may be suitably selected from various kinds of high molecular materials.

Specific examples of the binder polymer include a (meth) acrylic acid ester polymer, a copolymer of a (meth) acrylic acid ester and (meth)acrylic acid, a styrenemaleic anhydride copolymer, and a reaction product of a styrenemaleic anhydride copolymer and an alcohol. The term "(meth)acrylic" used herein means "acrylic or methacrylic".

The amount of the binder polymer is generally in the range of from 0 to 80% by weight based on the total solid components of the photoresist resin composition.

The photoresist resin composition (N-1), (N-2) and (NP) of the present invention may further comprise a reactive diluent, if necessary. As the reactive diluent, a low-viscous liquid compound having one or two vinyloxyalkyl groups in the molecule is generally used.

Specific examples of the reactive diluent include ethyl vinyl ether, propyl vinyl ether, isobutyl vinyl ether, octadecyl vinyl ether, vinyl cyclohextl ether, vinyl-4-hydroxy butyl ether, butanediol vinyl ether, triethylene glycol divinyl ether, etc.

The amount of the reactive diluent is generally in the range of from 0 to 70% by weight, and preferably from 0 to 30 by weight, based on the amount of the photopolymerizable monomer.

Examples of the alkyl, aryl, alkenyl, alkoxy, aralkyl or alkylthio group denoted by $R_3$, $R_4$ or $R_5$ in formula (II) include $C_1$–$C_4$ alkyl, phenyl, naphthyl, $C_1$–$C_4$ alkenyl, $C_1$–$C_4$ alkoxy, $C_1$–$C_4$ alkyl substituted by phenyl, $C_1$–$C_4$ alkenyl substituted by phenyl and $C_1$–$C_4$ alkylthio. In the examples, the alkyl, aryl, alkenyl, alkoxy or aralkyl may be substituted by one or more of halogen atoms. In the examples, phenyl and naphthyl may be substituted by $C_1$–$C_4$ alkyl, $C_1$–$C_4$ alkenyl or $C_1$–$C_4$ alkoxy.

Examples of the triazine compound of formula (II) include 2-phenyl-4,6-bis(trichloromethyl)-1,3,5-triazine, 2-(p-chlorophenyl-4,6-bis(trichloromethyl)-1,3,5-triazine, 2-(p-tolyl)-4,6-bis(trichloromethyl)-1,3,5-triazine, 2-(p-methoxyphenyl)-4,6-bis(trichloromethyl)-1,3,5-triazine, 2-(2,3-methylene-dioxyphenyl)-4,6-bis(trichloromethyl)-1,3,5-triazine, 2-methyl-4,6-bis(trichloromethyl)-1,3,5-triazine, 2-ethyl-4,6-bis(trichloromethyl)-1,3,5-triazine, 2,4,6-tris(trichloromethyl)-1,3,5-triazine, 2,4,6-tris(dichloromethyl)-1,3,5-triazine, 2,4,6-tris(monochloromethyl)-1,3,5-triazine, 2-($\alpha,\alpha,\beta$-trichloroethyl)-4,6-bis(trichloromethyl)-1,3,5-triazine, 2-styryl-4,6-bis(trichloromethyl)-1,3,5-triazine, 2-(p-methoxystyryl)-4,6-bis(trichloromethyl)-1,3,5-triazine, 2-(3,4,5-trimethoxystyryl)-4,6-bis(trichloromethyl)-1,3,5-triazine, 2-(1-naphthyl)-4,6-bis(trichloromethyl)-1,3,5-triazine, 2-(4-methoxy-1-naphthyl)-4,6-bis(trichloromethyl)-1,3,5-triazine, 2-(p-methylthiophenyl)-4,6-bis(trichloromethyl)-1,3,5-triazine, 2-(p-methylthiostyryl)-4,6-bis(trichloromethyl)-1,3,5-triazine, 2,4,6-tris(tribromomethyl)-1,3,5-triazine, 2-methyl-4,6-bis(tribromomethyl)-1,3,5-triazine, 2,4,6-tris(dibromomethyl)-1,3,5-triazine, 2-methoxy-4,6-bis(tribromomethyl)-1,3,5-triazine and 2-methylthio-4,6-bis(tribromomethyl)-1,3,5-triazine. Among them, a triazine compound of formula (II) wherein two or more of $R_3$, $R_4$ and $R_5$ are trichloromethyl or tribromomethyl is preferable. Particularly, a triazine compound represented by the following formula is preferred.

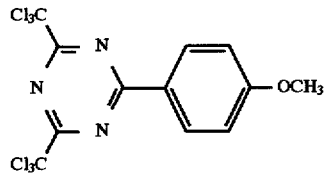

The amount of the triazine compound in the photoresist composition of the present invention is preferably in a range of from 1 to 20% by weight, more preferably from 1 to 10% by weight, based on total amount of the photopolymerizable monomer and the reactive diluent.

Examples of the solvent used for the photoresist compositions (N-1), (N-2) and (NP) of the present invention include ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl acetates such as methyl cellosolve acetate and ethyl cellosolve acetate; propylene glycol alkylether acetates such as propylene glycol monomethyl ether acetate, propylene glycol monoethyl ether acetate and propylene glycol monopropyl ether acetate; aromatic hydrocarbons such as benzene, toluene and xylene; ketones such as methyl ethyl ketone, acetone, methyl isobutyl ketone and cyclohexanone; alcohols such as ethanol, propanol, butanol, hexanol, cyclohexanol, ethylene glycol and glycerol; and exters such as ethyl lactate. Among these, ethyl cellosolve acetate, propylene glycol monomethyl ether, ethyl lactate, and metyhl isobutyl ketone are preferred.

These solvents may be used singly or as a mixture of two of more thereof. The amount of the solvent is preferably from 20 to 2,000% by weight based on the amount of the total solid components.

The photoresist composition (N-1), (N-2) and (NP) of the present invention can be used for the production of a color filter by a pigment dispersion method by compounding therewith pigments(s).

Examples of the pigment include inorganic pigments such as barium sulface, bismuth sulfide, zinc white, lead sulfate, titanium oxide, yellow lead, iron oxide red, ultramarine blue, Prussian blue, chromium oxide and carbon black; and organic pigments shown as the following color index numbers (C.I.):

C.I. Yellow pigments 20, 24, 86, 93, 109, 110, 117, 125, 137, 138, 139, 147, 148, 153, 154, 166, and 168;
C.I. Orange pigments 36, 43, 51, 55, 59, and 61;
C.I. Red pigments 9, 97, 122, 123, 149, 168, 177, 180, 192, 215, 216, 217, 220, 223, 224, 226, 227, 228, 240, and 48:1;
C.I. Violet pigments 19, 23, 29, 30, 37, 40, and 50;
C.I. Blue pigments 15, 15:6, 22, 60, and 64;
C.I. Green pigments 7, and 36;
C.I. Brown pigments 23, 25, and 26; and
C.I. Black pigments 7.

The amount of the pigment used for the photoresist composition (N-1), (N-2) and (NP) of the present invention in the case of producing the color filter is generally from 20 to 80% by weight based on the total solid contents of the composition.

A basic stabilizer can be added to the photoresist composition (N-1), (N-2) and (NP) of the present invention, if desired. Examples thereof include tertiary amine compounds such as trithylamine, tributylamine and DBU (diazabicycloundecene); sodium hydroxide; and potassium hydroxide.

Because the addition of a large amount of the basic stabilixer to the photoresist composition of the present invention hinders its photosensitivity, the addition amount is generally in the range of from 0.01 to 15% by weight, and preferably not more than 5% by weight, based on the total amount of the photopolymerizable monomer and the reactive diluent.

Other conventional agents such as a leveling agent may be added to the photoresist composition (N-1), (N-2) or (NP) present invention for imparting a uniformity on coating the photoresist composition.

The photoresist composition (N-1), (N-2) and (NP) of the present invention can be obtained by mixing the components described above, with applying, if necessary, treatments such as a dispersing treatment to the mixture.

The photoresist composition (N-1), (N-2) and (NP) of the present invention can be used for a photolithography.

When the photoresist composition is compounded with a proper pingment, it can be used for producing a color filter (one or both of the color portions and the black martix portions) for a liquid crystal displaying apparatus utilizing the pattern formation by a photolithography.

Only by changing the kind and/or the amount of the triazine compound of formula (II), and/or by changing the exposure amount, the characteristic of the photoresist composition (NP) of the present invention can be changed from positive working type to negative working type, vice versa. The characteristic of the photoresist composition (NP) is usually changed from negative working type to positive working type only when the amount of acid generated on the exposure to the radiation increases, and the amount of acid can be increased, for example, by increasing the amount of the triazine compound of formula (II) or by increasing the exposure amount.

The photolithography using the photoresist composition of the present invention can be carried out, for example, as follows:

The resist solution is spin-coated on a substrate followed by heat-drying (pre-baking) to form a smooth coated layer.

The coated layer thus obtained was irradiated with ultraviolet rays through a negative mask or a positive mask for forming a desired image. For uniformly irradiating the whole the coated layer with parallel ultraviolet rays, it is preferred to use an appropriate apparatus such as a mask alignment.

The irradiated coated layer is then post hardened (post exposure baking) by heating the layer to a temperature of from 60° to 120° C. for from 1 to 60 minutes.

The coated layer post hardened is immersed in a dilute aqueous alkali solution to dissolve the unhardened portions, whereby the desired image is developed.

After development, the imaged layer may be further post hardened at a temperature of from about 100° to 250° C. and for from about 5 to 20 minutes.

The present invention is described in more detail by the following examples but the invention is not construed as being limited by these examples.

EXAMPLE

Synthesis Example 1

33.0 g of a resorcin-novolac resin (OH equivalent: 59) obtained by the condensation reaction of resorcin and formalin, and 100 g of dimethylsulfoxide were charged in a reaction vessel equipped with a reflux condenser, a thermometer, a stirrer and a nitrogen gas introducing mean; and the resorcin-novolac resin was dissolved. Then, 31.9 g of powdery sodium hydroxide was added to the resulting solution, followed by stirring for 30 minutes at 60° C. Thereafter, 24.7 g of 2-chloroethyl vinylether was dropwise added thereto over a period of 1 hour while keeping the inner temperature of the reaction vessel at 60° C. and the resulting mixture was kept at 60° C. for 4 more hours to complete the reaction.

After neutralizing excessive sodium hydroxide with 20.0 g of a 10% aqueous solution of phosphoric acid, 300 g of methyl isobutyl ketone and 150 g of water were added to the reaction mixture, whereby the desired product was extracted into the organic layer and inorganic salts were dissolved in the aqueous layer.

Thereafter, the organic layer was collected, washed five times each with 200 g of 20% aqueous solution of sodium chloride, dried with anhydrous sodium sulfate, and filtered. Then, methyl isobutyl ketone was distilled off from the organic layer under a reduced pressure to obtain 53.0 g of the desired product.

In the infrared absorption spectra of the product, the absorptions based on a vinyl group were observed at 1610 $cm^{-1}$ and 975 $cm^{-1}$ and the absorption based on an ether bond was observed at 1200 $cm^{-1}$. The vinyl ether substituted ratio was calculated from the result of measurement of the residual phenolic hydroxy group by a neutralization titration method. The vinyl ether substituted ratio thus calculated was 50%.

The compound thus obtained was a polyfunctional vinyl ether compound represented by the following formula:

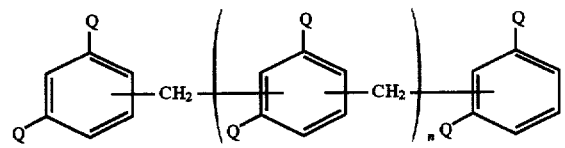

wherein mean value of n is 3.0 and Q was composed of —OH and —$OCH_2CH_2OCH=CH_2$ at a molar ratio (—OH/—$OCH_2CH_2OCH=CH_2$) of 50/50. Hereinafter, the compound thus obtained is referred as "Compound 1".

Synthesis Example 2

37.5 g of a novolac resin (Sumikanol 620 produced by Sumitomo Chemical Co., Ltd.; OH equivalent: 75) obtained by the condensation reaction of p-cresol, p-tert-octylphenol and resorcin with formalin, and 187.5 g of dimethylsulfoxide were charged in a reaction vessel equipped with a reflux condenser, a thermometer, a stirrer and a nitrogen gas introducing mean; and the novolac resin was dissolved. Then, 12.0 g of powdery sodium hydroxide was added to the resulting solution, followed by stirring for 30 minutes at 60° C. Thereafter, 38.4 g of 2-chloroethyl vinylether was dropwise added thereto over a period of 1 hour while keeping the inner temperature of the reaction vessel at 60° C. and the resulting mixture was kept at 60° C. for 6 more hours to complete the reaction.

After neutralizing excessive sodium hydroxide with 3.0 g of a 10% aqueous solution of phosphoric acid, 450 g of methyl isobutyl ketone and 400 g of water were added to the reaction mixture, whereby the desired product was extracted into the organic layer and inorganic salts were dissolved in the aqueous layer.

Thereafter, the organic layer was collected, washed five times each with 400 g of 20% aqueous solution of sodium chloride, dried with anhydrous sodium sulfate, and filtered. Then, methyl isobutylketone was distilled off from the organic layer under a reduced pressure to obtain 52.7 g of the desired product.

In the infrared absorption spectra of the product, the absorptions based on a vinyl group were observed at 1610 $cm^{-1}$ and 975 $cm^{-1}$ and the absorption based on an ether bond was observed at 1200 $cm^{-1}$. The vinyl ether substituted ratio was calculated from the result of measurement of the residual phenolic hydroxy group by a neutralization titration method. The vinyl ether substituted ratio thus calculated was 60%.

The compound thus obtained was a polyfunctional vinyl ether compound represented by the following formula:

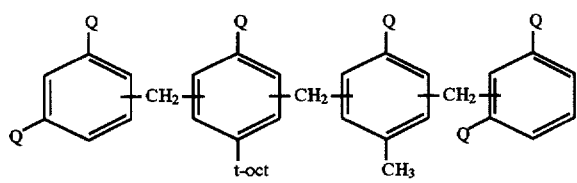

wherein t-oct represents a tert-octyl group and Q was composed of —OH and —OCH$_2$CH$_2$OCH=CH$_2$ at a molar ratio (—OH/—OCH$_2$CH$_2$OCH=CH$_2$) of 40/60. Hereinafter, the compound thus obtained is referred as "Compound 2".

Synthesis Example 3

22.3 g of a catechol-novolac resin (OH equivalent: 58.4) obtained by the condensation reaction of catechol with formalin, and 50.0 g of dimethylsulfoxide were charged in a reaction vessel equipped with a reflux condenser, a thermometer, a stirrer and a nitrogen gas introducing mean; and the catechol-novolac resin was dissolved. Then, 8.8 g of powdery sodium hydroxide was added to the resulting solution, followed by stirring for 30 minutes at 60° C. Thereafter, 22.5 g of 2-chloroethyl vinylether was dropwise added thereto over a period of 1 hour while keeping the inner temperature of the reaction vessel at 60° C. and the resulting mixture was kept at 100° C. for 5 more hours to complete the reaction.

After neutralizing excessive sodium hydroxide with 4.0 g of a 10% aqueous solution of phosphoric acid, 50 g of methyl isobutylketone and 100 g of water were added to the reaction mixture, whereby the desired product was extracted into the organic layer and inorganic salts were dissolved in the aqueous layer.

Thereafter, the organic layer was collected, washed five times each with 100 g of 20% aqueous solution of sodium chloride, dried with anhydrous sodium sulfate, and filtered. Then, methyl isobutylketone was distilled off from the organic layer under a reduced pressure to obtain 32.8 g of the desired product.

In the infrared absorption spectra of the product, the absorptions based on a vinyl group were observed at 1610 cm$^{-1}$ and 975 cm$^{-1}$ and the absorption based on an ether bond was observed at 1200 cm$^{-1}$. The vinyl ether substituted ratio was calculated from the result of measurement of the residual phenolic hydroxy group by a neutralization titration method. The vinyl ether substituted ratio thus calculated was 55%.

The compound thus obtained was a polyfunctional vinyl ether compound represented by the following formula:

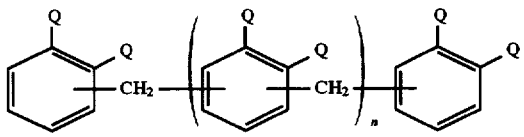

wherein mean value of n is 3.0 and Q was composed of —OH and —OCH$_2$CH$_2$OCH=CH$_2$ at a molar ratio (—OH/—OCH$_2$CH$_2$OCH=CH$_2$) of 45/55. Hereinafter, the compound thus obtained is referred as "Compound 3".

Synthesis Example 4

27.2 g of a novolac resin (OH equivalent: 67.9) obtained by the condensation reaction of catechol with 4-hydroxy benzaldehyde and 50.0 g of dimethylsulfoxide were charged in a reaction vessel equipped with a reflux condenser, a thermometer, a stirrer and a nitrogen gas introducing mean; and the novolac resin was dissolved. Then, 10.0 g of powdery sodium hydroxide and 5.4 g of tetrabutylammonium bromide were added to the resulting solution, followed by stirring for 30 minutes at 60° C. Thereafter, 28.1 g of 2-chloroethyl vinylether was dropwise added thereto over a period of 20 minutes while keeping the inner temperature of the reaction vessel at 60° C. and the resulting mixture was kept at 90° C. for 6 more hours to complete the reaction.

After neutralizing excessive sodium hydroxide with 2.0 g of a 85% aqueous solution of phosphoric acid, 300 g of methyl isobutylketone and 300 g of water were added to the reaction mixture, whereby the desired product was extracted into the organic layer and inorganic salts were dissolved in the aqueous layer.

Thereafter, the organic layer was collected, washed eight times each with 300 g of 10% aqueous solution of sodium chloride, dried with anhydrous sodium sulfate, and filtered. Then, methyl isobutylketone was distilled off from the organic layer under a reduced pressure to obtain 35.0 g of the desired product.

In the infrared absorption spectra of the product, the absorptions based on a vinyl group were observed at 1610 cm$^{-1}$ and 975 cm$^{-1}$ and the absorption based on an ether bond was observed at 1200 cm$^{-1}$. The vinyl ether substituted ratio was calculated from the result of measurement of the residual phenolic hydroxy group by a neutralization titration method. The vinyl ether substituted ratio thus calculated was 60%.

The compound thus obtained was a polyfunctional vinyl ether compound represented by the following formula:

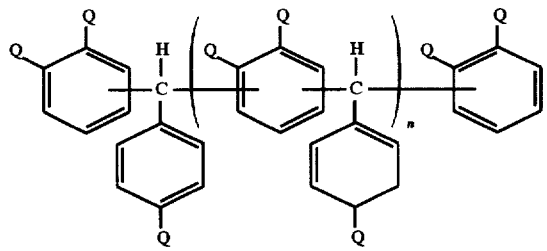

wherein mean value of n is 3.0 and Q was composed of —OH and —OCH$_2$CH$_2$OCH=CH$_2$ at a molar ratio (—OH/—OCH$_2$CH$_2$OCH=CH$_2$) of 40/60. Hereinafter, the compound thus obtained is referred as "Compound 4".

Examples and Comparative Examples

Compositions shown in Table 1, 2 and 3 were prepared and evaluated according to the method mentioned below. Numbers in Table 1, 2 and 3 indicate "part by weight".

TABLE 1

|  | Comparative Example 1 | Comparative Example 2 | Comparative Example 3 |
|---|---|---|---|
| Compound 1 | 6.0 | — | — |
| Compound 2 | — | 6.0 | — |
| Compound 3 | — | — | 6.0 |
| FX-512 | 0.3 | 0.3 | 0.3 |
| Butyl acetate | 14 | 14 | 14 |

FX-512: trade name:
Cationic photopolymerization initiator
manufactured by 3M Company.

TABLE 2

|  | Example 1 | Example 2 | Example 3 |
| --- | --- | --- | --- |
| Compound 1 | 6.0 | — | — |
| Compound 2 | — | 6.0 | — |
| Compound 3 | — | — | 6.0 |
| TRIAZINE A | 0.3 | 0.3 | 0.3 |
| Butyl acetate | 14 | 14 | 14 |

TRIAZINE A: trade name:
2-(p-methoxyphenyl)-4,6-bis(trichloromethyl)
-1,3,5-triazine:
a cationic photopolymerization initiator

TABLE 3

|  | Example 4 | Example 5 | Example 6 | Comparative Example 4 |
| --- | --- | --- | --- | --- |
| Compound 4 | 6.0 | 6.0 | 6.0 | 6.0 |
| TRIAZINE A | 0.3 | — | 0.6 | — |
| TRIAZINE B | — | 0.3 | — | — |
| IRUGACURE-261 | — | — | — | 0.3 |
| Butyl acetate | 14 | 14 | 14 | 14 |

TRIAZINE B: trade name:
2-(4-methoxy-1-naphthyl)
-4,6-bis(trichloromethyl)-1,3,5-triazine:
a cationic photopolymerization initiator
manufactured by PANCHIM Company.
IRUGACURE-261: trade name:
a iron-allene complex type cationic
photopolymerization initiator manufactured by
Ciba-Geigy Company.

Each composition shown in Table 1, 2 and 3 was filtered under pressure using a membrane filter (mesh: 1μ m) to prepare negative working photoresist resin compositions.
Evaluation:

A glass plate as a transparent substrate was washed with a neutral detergent, water, and then an alcohol, followed by drying.

Each phohoresist composition shown in Table 1, 2 or 3 was coated on the glass substrate by spin coating at 1,000 to 4,000 r.p.m. and pre-baked at 60° C. for 5–10 minutes.

The coated layer was then subjected to a patternwise exposure by a light exposure means, KASPER 2001 (trade name, manufactured by KASPER Co.).

Thereafter, the exposed layer was subjected to post exposure baking for 10 minutes at 80° C. for Examples 1–3, and Comparative examples 1–3;

for 15 minutes at 75° C. for Examples 4 and 5, and Comparative examples 4; or for 15 minutes at 100° C. for Examples 6 and developed by treating the layer with a 3% aqueous solution for example 1–3 and comparative example 1–3; or a 2.3% aqueous solution for example 4–5 and comparative example 4 of sodium hydroxide for 30 seconds at 25° C.

The layer thickness was adjusted such that the thickness became from 1 to 1.5 μm after exposure and development. The results are shown in Table 4 below.

In Table 4, the term "sensitivity" means the lowest light exposure energy amount for forming residual layers on the substrate after development. A smaller value shows a higher sensitivity.

The "resolution" was measured using a figure (line & space) wherein several lines were arranged with the same interval as the width of the line. A set of several figures in which the line width of each figure was changed was used as a mask, the pattern thereof was printed on the resist layer formed on the substrate, and the resolution limit was shown in terms of the minimum line width (μm) that could be reproduced.

TABLE 4

|  | Sensitivity mJ/cm² | Resolution μm | Oxygen Interception | Resist type |
| --- | --- | --- | --- | --- |
| Example 1 | 3 | 5 | none | negative |
| Example 2 | 3 | 8 | none | negative |
| Example 3 | 5 | 8 | none | negative |
| Comparative Example 1 | 10 | 10 | none | negative |
| Comparative Example 2 | 10 | 10 | none | negative |
| Comparative Example 3 | 50 | 10 | none | negative |
| Example 4 | 3 | 5 | none | negative |
| Example 5 | 10 | 5 | none | negative |
| Example 6 | 30 | 10 | none | positive |
| Comparative Example 4 | 50 | 5 | none | negative |

The photoresist resin composition of the present invention can be hardened without intercepting oxgen e.g. by nitrogen gas flow. It can be seen from the comparison of Examples 1–3 in which triazine compounds as photopolymerization initiators are used with Comparative examples 1–3 in which photopolymerization initiators different to the triazine compounds are used but photopolymerizable monomer same to those in Examples 1–3, respectively, are used that the negative photoresist resin composition of the present invention exhibits improved sensitivity and resolution, compared to conventional negative photoresist resin compositions.

It can be seen from the comparison of Examples 4–5 in which triazine compounds as photopolymerization initiators are used with Comparative examples 4 in which photopolymerization initiators different to the triazine compounds are used but photopolymerizable monomer same to those in Examples 4–5 are used that the negative photoresist resin composition of the present invention exhibits conspicuously improved sensitivity while maintaining high resolution compared to conventional negative photoresist resin compositions.

Therefore, by using the photoresist resin composition of the present invention, handling of the photoresist resin composition on photopolymerization becomes remarkably easier because oxgen intercepting is not required. Since the sensitivity has been conspicuously improved, the photoresist resin composition of the present invention is suitably used as a pigment dispersing photoresist.

It can be seen from Examples 4–6 that the photoresist resin composition of the present invention can be used not only as a negative working photoresist but also as a positive working photoresist only by changing the amount of triazine compound and the exposure amount while keeping sufficient properties as a photoresist resin composition such as sensitivity, resolution and developability with a dilute aqueous alkali solution.

What we claim is:

1. A negative working photoresist composition which comprises:

(1) a photopolymerizable monomer mixture represented by the following formula (I):

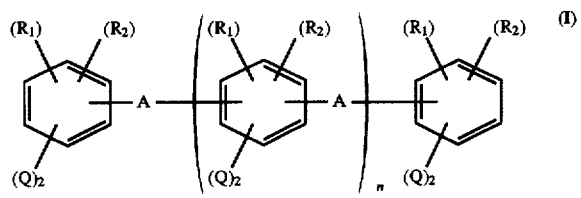

wherein n, which is an average repeating number, represents a number of from 0 to 20; $R_1$ and $R_2$ each independently represents a hydrogen atom, a halogen atom, an alkyl group, an aryl group, an aralkyl group, an alkoxy group, an aryloxy group or a cycloalkyl group; each of Q independently represents —OH or —OROCH=$CH_2$ in which R represents an alkylene group having 1–12 carbon atoms, provided that the molar ratio of (—OH)/(—OROCH=$CH_2$) is from 10/90 to 90/10; and A represents a divalent hydrocarbon group having 1–30 carbon atoms;

(2) a triazine compound represented by the following general formula (II):

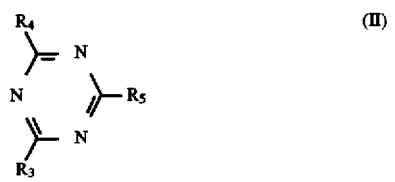

wherein $R_3$, $R_4$ and $R_5$ each independently represents an alkyl, alkyl substituted with phenyl, aryl, alkenyl, alkenyl substituted with phenyl, alkoxy, aralkyl or alkylthio group, wherein the alkyl, aryl, alkenyl, alkoxy and aralkyl group may be optionally substituted with one or more halogen atoms, and wherein if the aryl group is phenyl or naphthyl then the phenyl or naphthyl may be optionally substituted with $C_1$–$C_4$ alkyl, up to $C_4$ alkenyl or $C_1$–$C_4$ alkoxy, provided that at least one of $R_3$, $R_4$ and $R_5$ is a methyl group substituted with one, two or three halogen atoms; and (3) a solvent.

2. A photoresist composition according to claim 1, wherein the triazine compound of formula (II) is a compound represented by the following formula:

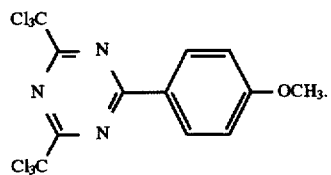

3. A photoresist composition according to claim 1, wherein two or all of $R_3$, $R_4$ and $R_5$ are trichloromethyl or tribromomethyl in formula (II).

4. A negative working photoresist composition which comprises:

(1) a photopolymerizable monomer mixture which contains 99.9 to 40% by mole of monomers represented by the following formula (I):

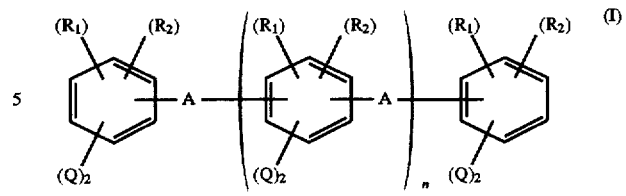

wherein n, which is an average repeating number, represents a number from 0 to 20; $R_1$ and $R_2$ each independently represents a hydrogen atom, a halogen atom, an alkyl group, an aryl group, an aralkyl group, an alkoxy group, an aryloxy group or a cycloalkyl group; each of Q independently represents —OH or —OROCH=$CH_2$ in which R represents an alkylene group having 1–12 carbon atoms, provided that the molar ratio of (—OH)/(—OROCH=$CH_2$) is from 10/90 to 90/10; and A represents a divalent hydrocarbon group having 1–30 carbon atoms; and from 0.1 to 60% by mole of monomers represented by a modified formula wherein the groups represented in formula (I) by the following formulae (III) or (IV):

wherein $R_1$, $R_2$ and Q are as defined in claim 1 are replaced, respectively, with each of the groups represented by the following formulae (V) or (VI):

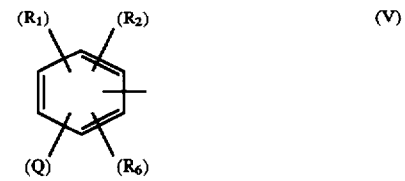

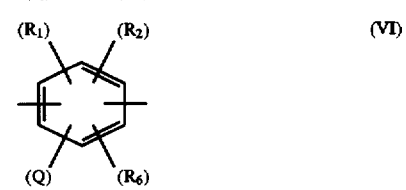

wherein $R_1$, $R_2$ and Q are as defined above, and $R_6$ represents a hydrogen atom, a halogen atom, an alkyl group, an aryl group, an aralkyl group, an alkoxy group, an aryloxy group or a cycloalkyl group;

(2) a triazine compound represented by the following general formula (II):

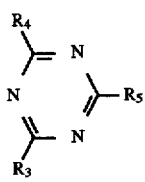

wherein $R_3$, $R_4$ and $R_5$ each independently represents an alkyl, alkyl substituted with phenyl, aryl, alkenyl, alkenyl substituted with phenyl, alkoxy, aralkyl or alkylthio group, wherein the alkyl, aryl, alkenyl, alkoxy and aralkyl group may be optionally substituted with one or more halogen atoms, and wherein if the aryl group is phenyl or naphthyl then the phenyl or naphthyl may be optionally substituted with $C_1$–$C_4$ alkyl, up to $C_4$ alkenyl or $C_1$–$C_4$ alkoxy, provided that at least one of $R_3$, $R_4$ and $R_5$ is a methyl group substituted with one, two or three halogen atoms; and (3) a solvent.

5. A photoresist composition according to claim 4, wherein the triazine compound of formula (II) is a compound represented by the following formula:

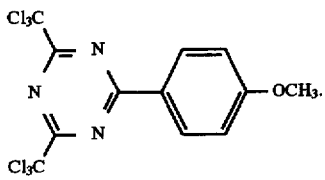

6. A photoresist composition according to claim 4, wherein two or all of $R_3$, $R_4$ and $R_5$ are trichloromethyl or tribromomethyl in formula (II).

7. A photoresist composition which comprises:

(1) a photopolymerizable monomer mixture represented by the following formula (VII):

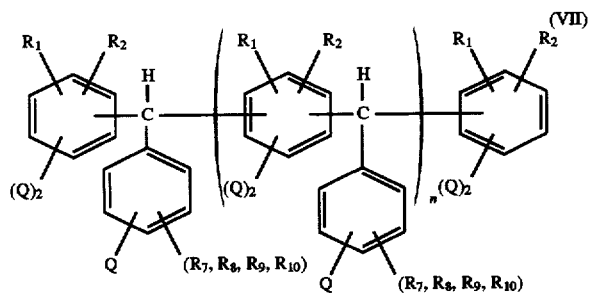

wherein n, which is an average repeating number, represents a number of from 0 to 20: $R_1$ and $R_2$ each independently represents a hydrogen atom, a halogen atom, an alkyl group, an aryl group, an aralkyl group, an alkoxy group, an aryloxy group or a cycloalkyl group; each of Q independently represents —OH or —OROCH=$CH_2$ in which R represents an alkylene group having 1–12 carbon atoms, provided that the molar ratio of (—OH)/(—OROCH=$CH_2$) is from 10/90 to 90/10; and ($R_7$, $R_8$, $R_9$, $R_{10}$) means that $R_7$, $R_8$, $R_9$ and $R_{10}$ are attached to a benzene ring, and $R_7$, $R_8$, $R_9$ and $R_{10}$ each independently represents a hydrogen atom, a halogen atom, an alkyl group, an aryl group, an aralkyl group, an alkoxy group, an aryloxy group or cycloalkyl group;

(2) a triazine compound represented by the following general formula (II):

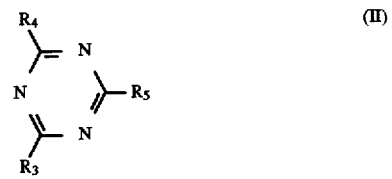

wherein $R_3$, $R_4$ and $R_5$ each independently represents an alkyl, alkyl substituted with phenyl, aryl, alkenyl, alkenyl substituted with phenyl, alkoxy, aralkyl or alkylthio group, wherein the alkyl, aryl, alkenyl, alkoxy and aralkyl group may be optionally substituted with one or more halogen atoms, and wherein if the aryl group is phenyl or naphthyl then the phenyl or naphthyl may be optionally substituted with $C_1$–$C_4$ alkyl, up to $C_4$ alkenyl or $C_1$–$C_4$ alkoxy, provided that at least one of $R_3$, $R_4$ and $R_5$ is a methyl group substituted with one, two or three halogen atoms; and (3) a solvent.

8. A photoresist composition according to claim 7 wherein a photopolymerizable monomer of formula (VII) is a compound represented by the following formula:

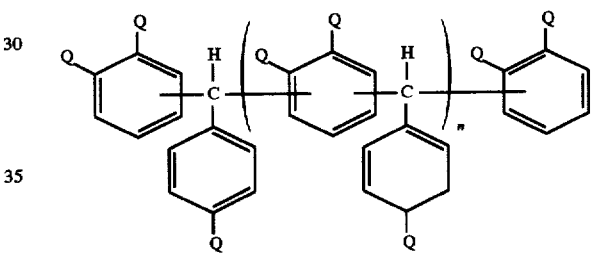

wherein average repeating number n is from 0 to 20, and each of Q independently represents —OH or —OCH$_2$CH$_2$OCH=CH$_2$, provided that the molar ratio of (—OH)/(—OCH$_2$CH$_2$OCH=CH$_2$) is from 10/90 to 90/10.

9. A photoresist composition according to claim 8, wherein the triazine compound of formula (II) is a compound represented by the following formula:

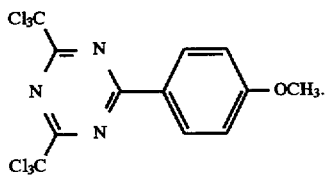

10. A photoresist composition according to claim 7, wherein two or all of $R_3$, $R_4$ and $R_5$ are trichloromethyl or tribromomethyl in formula (II).

* * * * *